United States Patent [19]

Gornati

[11] Patent Number: 4,904,959
[45] Date of Patent: Feb. 27, 1990

[54] CURRENT-CONTROLLED SAW-TOOTH WAVE OSCILLATOR STAGE

[75] Inventor: Silvano Gornati, Casorezzo, Italy

[73] Assignee: SGS-Thomson Microelectronics S.r.l., Agrate Brianza, Italy

[21] Appl. No.: 310,175

[22] Filed: Feb. 13, 1989

[30] Foreign Application Priority Data

Feb. 26, 1988 [IT] Italy .................. 19569 A/88

[51] Int. Cl.$^4$ ............................. H03K 3/26
[52] U.S. Cl. ................. 331/111; 331/108 C; 331/143
[58] Field of Search ........... 331/108 C, 111, 113 R, 331/143, 144

[56] References Cited

U.S. PATENT DOCUMENTS 4,122,413 10/1978 Chen ...................... 331/111 X

Primary Examiner—David Mis
Attorney, Agent, or Firm—Guido Modiano; Albert Josif

[57] ABSTRACT

This high-precision oscillator stage, with reduced response times, includes only NPN transistors on the signal path and comprises a threshold detector circuit connected to a first and to a second threshold voltage and to the output of the stage so as to generate a differential voltage output signal which switches when each voltage threshold is reached, a control and memory circuit comprising a differential voltage detector connected to the output of the threshold detector and generating a charge and discharge signal depending on the state of the circuit, a memory element controlled by the differential voltage detector to maintain the charge and discharge states and an output driving circuit connected to the control and memory circuit so as to supply an external capacitor with constant currents so as to alternately and periodically charge and discharge the capacitor.

8 Claims, 2 Drawing Sheets

CURRENT-CONTROLLED SAW-TOOTH WAVE OSCILLATOR STAGE

BACKGROUND OF THE INVENTION

The present invention relates to a current-controlled saw-tooth wave oscillator stage of the type with unswitched thresholds, in particular for high-definition television screens and monitors.

As is known, an oscillator stage capable of generating an appropriate saw-tooth wave is currently used to drive the horizontal and vertical deflection of monitors and television circuits. In particular, oscillators stages with markedly high performance in terms of operating frequency, temperature stability and output signal precision are required to drive high-definition television circuits and monitors.

For example, the integrated circuit illustrated in FIG. 1 is known for generating said driving signals. Said circuit constitutes a current-controlled oscillator and is capable of supplying a saw-tooth voltage $V_{OUT}$ at the output indicated by 5; the oscillation frequency of said voltage depends on the value of a resistive element $R_{EXT}$ and of a capacitive element $C_{EXT}$ which are normally external to the integrated circuit and are respectively connected to the terminals 1 and 2 thereof, as well as on the difference between two threshold values $V_1$ and $V_2$ generated internally to the circuit. In detail, the output voltage $V_{OUT}$ is obtained by charging and discharging the capacitor $C_{EXT}$ between the two thresholds $V_1$ and $V_2$. For this purpose, the oscillator stage comprises a first section 10 including a resistive divider for generating the threshold voltages and a buffer constituted by a fedback amplifier with unitary gain capable of supplying a reference voltage $V_{REF}$ at the terminal 1 to which the resistor $R_{EXT}$ is connected. This resistor connected between said terminal and the ground thus allows to precisely set a reference current I which is then appropriately mirrored so as to obtain stable current sources with values I/2 and 2I included in the driving section 12 of the actual saw-tooth wave generator, which is indicated as a whole by the reference numeral 11. Said saw-tooth wave generator furthermore comprises a threshold detector stage 13 connected at the input to the output $V_{OUT}$ of the oscillator stage. The detector circuit 13, which is also connected to the threshold voltages $V_1$ and $V_2$, defines a pair of outputs 14 and 15 on which appropriate pulses are available respectively when the upper threshold voltage $V_1$ or the lower threshold voltage $V_2$ are reached. Said outputs 14 and 15 are connected to a pair of switches indicated as a whole by 16 and respectively constituted by transistors $T_{11}$ and $T_{12}$ intended to transfer said threshold-reaching pulses to a flip-flop stage 17 at the inputs S and R thereof. The outputs of said flip-flop memory circuit 17 are sent to the bases of a differential circuit constituted by two transistors $T_1$ and $T_2$ belonging to the driving stage 12, so as to alternately switch on the transistor $T_2$ and to switch off the transistor $T_1$ (thus allowing the capacitor to charge at the constant current I/2) or to switch off transistor $T_2$ and to switch on the transistor $T_1$ (thus allowing the capacitor to discharge at the current 1.5I as an effect of the generators I/2 and 2I).

The capacitor is consequently discharged with a current three times higher than the charge current, thus creating a saw-tooth wave with a rise time $t_c$ equal to three times the fall time $t_d$. The period T of the resulting waveform can be easily calculated by means of the equation $$I\Delta t = C\Delta V$$

in which I is the charge or discharge current of the capacitor C in the time $\Delta t$ in the voltage range $\Delta V$. In this case one thus obtains $$T = C_{EXT}(V_1 - V_2)\left(\frac{i_c + i_d}{i_c i_d}\right)$$

wherein $i_c = I/2$ and $i_d = 1.5I$.

In order to achieve this behavior the threshold detector circuit 13 comprises two pairs of differential transistors $T_7$–$T_{10}$; which, as previously mentioned, when the upper or lower threshold is reached, send a reset or set pulse respectively at the output 14 or at the output 15, respectively to the base R of $T_6$ or to the base S of $T_3$ so as to alternately cause the transistors $T_1$ and $T_2$ to conduct, as previously explained.

It should be furthermore noted that, since the output signal $V_{OUT}$ must be available to the stages connected downstream for the subsequent processings, there is a buffer stage B which decouples it from the signal present on the terminal 2, thus avoiding "loading" effects which can alter the preset values of the charge and discharge currents (signal deformation).

The above described stage operates advantageously as to its flexibility, since the set current can be varied within a wide range through $R_{EXT}$ (which does not depend on the temperature), and because switch thresholds not depending on variable parameters but on integrated resistive dividers are available and the dynamics of the output signal (defined as the ratio between the charge time and the discharge time) can be varied within a wide range by varying the currents $i_c$ and $i_d$.

However, the described circuit is not suitable for driving high-definition television circuits and monitors. Said circuit is in fact incapable of providing the response rapidity and the precision required for this type of application due to the presence of PNP transistors (such as $T_{11}$ and $T_{12}$) and of saturating elements (i.e. the transistors $T_3$–$T_6$ of the flip-flop stage 17) on the signal path. The presence of these transistors limits the operating frequency of the stage, slowing the response time of the entire system, with the double effect of preventing the circuit from oscillating at high frequencies and of introducing an error on the peak values of the output signal with respect to the values of the preset thresholds. Said error is furthermore not fixed but depends on the temperature, which as is known influences the response times of transistors, causing the drift of the operating frequency with respect to its nominal value.

SUMMARY OF THE INVENTION

Given this situation, the aim of the present invention is to provide a saw-tooth wave oscillator stage of the indicated type, capable therefore of ensuring the flexibility and dynamics levels typical of the known circuit while at the same time overcoming its disadvantages.

Within this aim, a particular object of the present invention is to provide an oscillator stage which operates without saturating elements and without PNP-type transistors on the signal path, thus obtaining a high operating frequency of the stage.

Another particular object of the present invention is to provide an oscillator stage having practically negligible response times and therefore high temperature stability.

Still another object of the present invention is to provide an oscillator stage with high precision which switches exactly at the preset thresholds.

Not least object of the present invention is to provide an oscillator stage having an electrically simple structure which can be easily integrated and therefore implemented with modest costs.

This aim, these objects and others which will become apparent hereinafter are achieved by a saw-tooth wave oscillator stage as defined in the accompanying claims.

BRIEF DESCRIPTION OF THE DRAWINGS

The characteristics and advantages of the oscillator stage according to the invention will become apparent from the description of a preferred but not exclusive embodiment, illustrated only by way of non-limitative example in the accompanying drawings, wherein.

DESCRIPTION OF THE PREFERRED EMBODIMENTS

Figure 1:
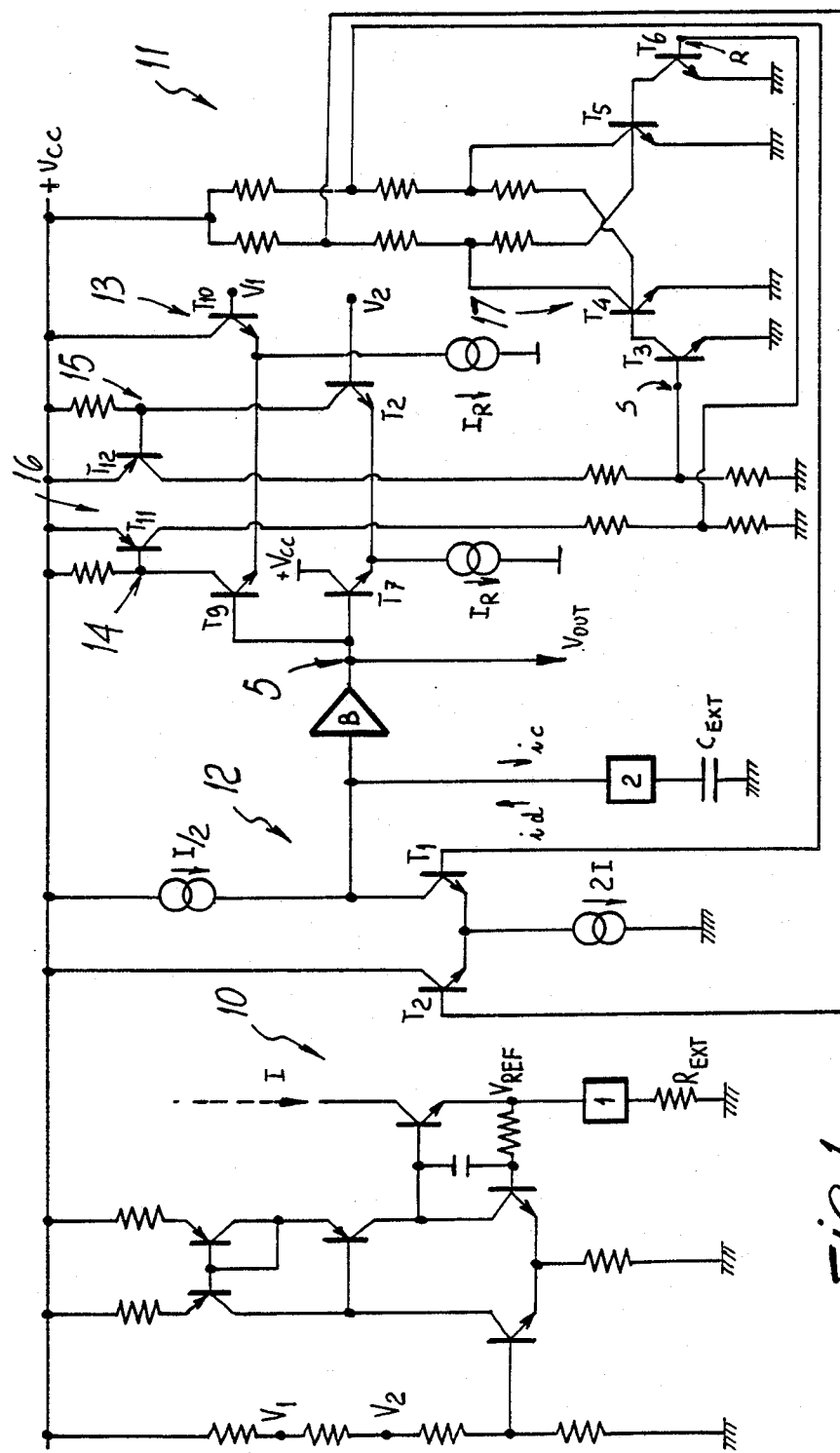
FIG. 1 is the electric circuit diagram of a known oscillator stage.

FIG. 1 is not described hereinafter: reference is made to the introduction of the present description for said figure.

Figure 3:
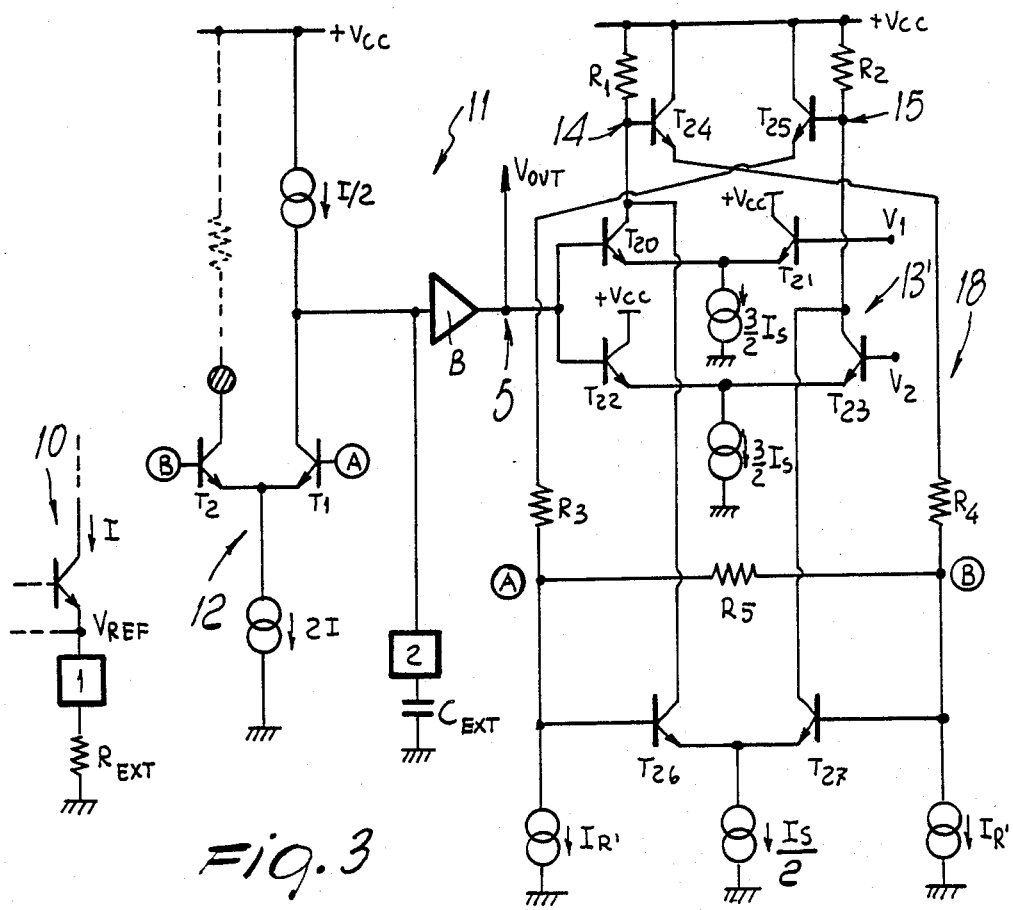
FIG. 3 is an electric circuit diagram of the oscillator stage according to the invention.

Reference is thus made to FIG. 3, illustrating the diagram of the oscillator stage according to the invention. In this diagram the parts which are equivalent or identical to the known oscillator circuit are indicated by the same reference numerals. In particular, the stage 10 for generating the reference and threshold currents and voltages is only partially illustrated, since it is entirely identical to the known one of FIG. 1. As regards the actual saw-tooth wave generator circuit 11, said circuit is again composed of a driving stage or circuit 12 and of a threshold detector circuit 13', but the control and memory circuit, which previously comprised the switches 16 and the flip-flop 17, is now indicated by 18. Similarly to the known oscillator stage, the driving circuit 12 comprises a pair of transistors $T_1$ and $T_2$ connected in differential configuration so as to alternately feed the capacitor $C_{EXT}$ with the charge current supplied by the generator I/2 or allow the controlled discharge of the capacitor at the current 1.5I. The terminal 2 connected to the capacitor $C_{EXT}$ is then connected, through the buffer B, to the output 5 feeding voltage $V_{OUT}$ and to an input of the threshold detector circuit 13', constituted here, too, by a pair of differential circuits formed by the transistors $T_{20}$–$T_{23}$. In detail, the base of $T_{20}$ is connected to the output of the oscillator stage, while the base of $T_{21}$ is connected to the upper voltage reference $V_1$, their emitters are connected to one another and to a constant-current sources with a value of 3/2 $I_S$, and the collector of $T_{21}$ is connected to the power supply $V_{CC}$ while the collector of $T_{20}$ defines an output 14 of the threshold circuit. In the circuit according to the invention, $T_{20}$ and $T_{21}$ are implemented so that the former has twice the area of the latter, so that when the differential circuit is balanced with the output $V_{OUT}$ at the upper threshold voltage, $T_{20}$ conducts twice the current of $T_{21}$. Similarly, in the lower differential circuit, the base of $T_{22}$ is connected to the output $V_{OUT}$, while the base of $T_{23}$ is connected to the lower voltage reference $V_2$, the emitters of the two transistors are connected to one another and to a constant-current source 3/2 $I_S$, the collector of $T_{22}$ is connected to the supply voltage while the collector of $T_{23}$ defines the output 15. Similarly to the upper differential, the area of $T_{23}$ is twice that of $T_{22}$. The collector of $T_{20}$ and the collector of $T_{23}$ are furthermore connected to the supply voltage $V_{CC}$ by means of respective resistors $R_1$ and $R_2$ of equal value.

According to the invention, the control and memory circuit 18 now comprises a detector of the differential voltage existing between the outputs 14 and 15 of the threshold circuit 13' and by a differential circuit acting as memory, controlled by circuit 13' and connected in parallel to the circuit 12. In detail, the differential voltage detector comprises a pair of transistors $T_{24}$ and $T_{25}$ and by resistors $R_3$–$R_5$. The transistor $T_{24}$ has its base terminal connected to the output 14 and its collector terminal connected to the power supply, while its emitter is connected to $R_4$; $T_{25}$ has its base connected to the output 15, its collector connected to the power supply and its emitter connected to the resistor $R_3$. As can be seen, both transistors $T_{24}$ and $T_{25}$ are of the NPN type. In turn the resistors $R_3$ and $R_4$ are connected to the two terminals of $R_5$ at the points indicated by A and B connected to the bases of $T_1$ and $T_2$ respectively. Constant reference current sources $I_R$, are furthermore connected to the points A and B. In turn, the memory element, which confirms the charge or discharge state of the capacitor started by means of the differential voltage detector circuit, comprises the transistors $T_{26}$ and $T_{27}$, also of the NPN type, connected in a differential arrangement and precisely with their bases respectively connected to point A and to point B, their collectors respectively connected to the output 14 and the output 15, and their emitters connected to one another and to the constant-current source $I_S/2$.

Figure 2A:
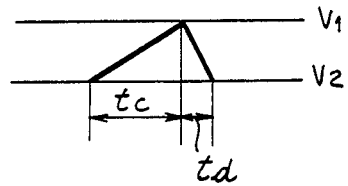
FIGS. 2a and 2b illustrate voltage signals obtainable by the oscillator stage according to the invention.

The oscillator stage according to the invention operates as follows. Similarly to the known circuit, when the voltage at point A is lower than that at point B the transistor $T_1$ is off and the external capacitor is charged in a linear manner by the current I/2, following the rising line shown in FIG. 2A. During this step the voltage $V_{OUT}$ is at an intermediate value between the two thresholds, so that the transistors $T_{21}$, $T_{22}$ and $T_{27}$ are on while the transistors $T_{20}$, $T_{23}$ and $T_{26}$ are off. In this condition, the base of $T_{24}$ is approximately biased to the supply voltage $V_{CC}$ (ignoring the small drop on the resistor $R_1$ due to the base current of $T_{24}$), while the base of $T_{25}$ is biased to the voltage $V_{CC} - R_2 I_S/2$.

The differential signal present between the outputs 14 and 15 (i.e. between the bases of $T_{24}$ and $T_{25}$) and therefore between the emitters of said transistors is thus equal to $R_2 I_S/2$, causing a voltage drop across the resistor $R_5$ equal to $$V_B - V_A = R_2 \frac{I_S}{2} \frac{R_5}{R_3 + R_4 + R_5}$$

since the path of the signal affects exclusively the transistors $T_{24}$, $T_{25}$ and the resistors $R_3$–$R_5$.

A signal current $I_X$ thus flows across the resistor $R_5$ from point B to point A with a value equal to $(V_B - V_A)/R_5$, so that if the base currents of $T_{27}$ and $T_{26}$ are ignored the transistor $T_{24}$ conducts the current $I_R' + I_X$ while the transistor $T_{25}$ conducts the current $I_R' - I_X$.

When the output voltage $V_{OUT}$ (and therefore the voltage on the base of $T_{20}$) reaches the upper threshold value $V_1$ the transistor $T_{20}$ conducts the current $I_S$ since the differential circuit $T_{20}$, $T_{21}$ is balanced and, due to the area ratio, $T_{20}$ conducts twice the current of $T_{21}$. A voltage drop equal to $R_1 I_S$ thus occurs across $R_1$, while a voltage equal to $R_2 I_S/2$ is still present across $R_2$. This causes a reversal of the differential signal present between the outputs 14 and 15 and therefore between the emitters of $T_{24}$ and $T_{25}$, which reversal in turn entails a reversal in the flow direction of the current $I_X$ flowing across the resistor $R_5$. $T_{24}$ consequently now conducts a current equal to $I_R' - I_X$ while $T_{25}$ conducts a current equal to $I_R' + I_X$.

The voltage at point A is consequently higher than the voltage of point B, causing the differential circuit $T_{26}$, $T_{27}$ to switch. Therefore, in this operation state $T_{26}$ and $T_1$ switch on while $T_{27}$ and $T_2$ switch off, thus starting the discharge of the capacitor $C_{EXT}$ at the current 1.5I. The start of the discharge state also causes switching off of $T_{20}$; its switching off however entails no problems, since the switching on of $T_{26}$ has meanwhile already confirmed the threshold crossing condition.

During discharge the situation is similar and complementary to the one already described during charging. In particular, during this phase the transistors $T_{21}$, $T_{22}$, $T_{26}$ and $T_1$ are on, $T_{20}$, $T_{23}$, $T_{27}$ and $T_2$ are off, the base of $T_{24}$ is biased at the voltage $V_{CC} - R_1 I_S/2$ and the base of $T_{25}$ is practically at the supply voltage.

Finally, when the output signal $V_{OUT}$ reaches the lower threshold $V_2$, $T_{23}$ conducts the current $I_S$ and therefore causes a pulse at the base of $T_{25}$ which again unbalances the differential circuits $T_{26}$ and $T_{27}$, $T_1$ and $T_2$. When the charging of the external capacitor again resumes, the conduction of $T_{27}$ stores the information that the threshold has been reached, confirming the charging condition of the capacitor and thus obtaining the signal shown in FIG. 2A. In practice, the differential circuit $T_{26}$, $T_{27}$ acts as state memory, thus implementing the function performed by the flip-flop in the known circuit.

Figure 2B:
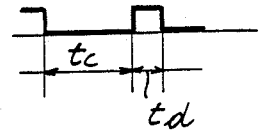

It should be furthermore noted that the circuit can also provide at the output a square wave at the collector of $T_2$ (open collector), said square wave having the same dutycycle as the saw-tooth wave signal supplied at the output and shown in FIG. 2b.

As can be seen from the preceding description, the invention fully achieves the proposed aim and objects. The oscillator stage according to the invention is in fact capable of generating the required saw-tooth wave without using PNP or saturating transistors on the signal path. The oscillator stage according to the invention is therefore capable of operating even at high frequencies, higher than those obtainable with the known circuit.

The described circuit furthermore has high temperature stability, since the response times of the system (which are a function of the temperature) are practically negligible as PNP transistors, which are slower than NPN ones, have been eliminated.

The rapid response of the system furthermore entails high precision also by virtue of the fact that the switching thresholds are linked to integrated resistive dividers. This high precision is also obtained by virtue of the fact that the transistors of the differential circuits of the threshold detector circuit have an appropriate area ratio, as indicated, and thus conduct the current required to switch the memory element already during the balancing of one of the differential circuits of the threshold detector. The illustrated solution is furthermore circuitally simple and easy to integrate, entailing reduced manufacturing costs.

Finally, the fact is stressed that the circuit according to the invention allows to achieve the above described aims without having to renounce the advantages already featured by known structures such as the possibility to vary the operating frequency and the dynamics of the output signal within a wide range, furthermore providing at the output a square-wave signal with the same duty-cycle as the required saw-tooth signal.

The invention thus conceived is susceptible to numerous modifications and variations, all of which are within the scope of the inventive concept. In particular all the circuit elements may be replaced with other technically equivalent ones capable of performing the same functions.

I claim:

1. A saw-tooth wave oscillator stage having an output terminal feeding a drive signal for driving a capacitive element to be alternately and periodically brought in a charge and in a discharge state and generating an output signal, said stage comprising:
    a first and a second, upper and lower, threshold voltages,
    a threshold detector circuit connected to said first and second threshold voltages and to said output terminal and having a pair of detector circuit outputs defining a differential voltage switching between a positive and a negative sign when said output signal reaches said first and second thresholds,
    a control and memory circuit connected to said detector circuit outputs for generating a differential charge and discharge signal alternately and periodically having charge and discharge phases, and
    an output driving circuit receiving said charge and discharge signal and generating said drive signal,
    wherein said control and memory circuit comprises a differential voltage detector connected between said detector circuit outputs for detecting switching of said sign of said differential voltage and for correspondingly switching said differential charge and discharge signal between said charge and discharge phases, and a memory element controlled by said differential voltage detector and connected to said driving circuit for maintaining said charge and discharge phases until subsequent switching of said differential voltage.

2. A stage according to claim 1, wherein said differential voltage detector comprises a pair of transistors having emitter, base and collector terminals, said base terminals being connected to a respective one of said detector circuit outputs and said emitter terminals being mutually connected through at least one resistive element generating said differential charge and discharge signal.

3. A stage according to claim 1, wherein said memory element comprises a differential circuit including a pair of transistors having emitter, base and collector terminals, said emitter terminals being mutually coupled and connected to a current source, said collector terminals being connected to a respective one of said detector circuit outputs and said base terminals connected to said differential voltage detector.

4. A stage according to claim 1, wherein said threshold detector circuit comprises two differential stages each including a first transistor and a second transistor having coupled emitter terminals, said first transistor of said first differential stage having a base terminal connected to said output terminal and a collector terminal forming a first output of said threshold detector circuit, said second transistor of said first differential stage having a base terminal connected to said first threshold voltage, said first transistor of said second differential stage having a base terminal connected to said output terminal and said second transistor of said second differential stage having a base terminal connected to said second threshold voltage and a collector terminal forming the second output of said threshold detector circuit, said first transistor of said first differential stage and said second transistor of said second differential stage having an area which is a multiple of an area of said second transistor of said first differential stage and of said first transistor of said second differential stage.

5. A stage according to claim 4, wherein the areas of said first transistor of said first differential stage and of said second transistor of said second differential stage are twice the areas of said second transistor of said first differential stage and of said first transistor of said second differential stage.

6. A stage according to claim 1, wherein said memory element comprises a first differential circuit including a first pair of transistors having mutually coupled emitter terminals which are connected to a constant current source feeding a first constant current and said threshold detector circuit comprises two further differential stages each including first and second transistors having emitter terminals, said emitter terminals of said transistors of each of said further differential stages being mutually coupled and being connected to a further current source feeding a second constant current which is three times higher than said first constant current.

7. A stage according claim 2, wherein said detector circuit outputs are connected to a supply voltage through respective substantially equal resistors and said emitter terminals of said pair of transistors of said differential voltage detector are connected to said resistive element through further respective equal resistors.

8. A stage according to claim 1, wherein said threshold detector circuit, said differential voltage detector and said memory element comprise differential circuits including transistors of the NPN type.

* * * * *